(12) United States Patent
Takeishi (10) Patent No.: US 8,728,330 B2
(45) Date of Patent: May 20, 2014

(54) CHEMICAL LIQUID SUPPLY DEVICE AND CHEMICAL LIQUID SUPPLY METHOD

(75) Inventor: Toshio Takeishi, Koganei (JP)

(73) Assignee: Koganei Corporation, Tokyo (JP)

( * ) Notice: Subject to any disclaimer, the term of this patent is extended or adjusted under 35 U.S.C. 154(b) by 183 days.

(21) Appl. No.: 13/505,795

(22) PCT Filed: Jul. 13, 2010

(86) PCT No.: PCT/JP2010/061831
§ 371 (c)(1),
(2), (4) Date: Jun. 14, 2012

(87) PCT Pub. No.: WO2011/058792
PCT Pub. Date: May 19, 2011

(65) Prior Publication Data
US 2012/0241469 A1    Sep. 27, 2012

(30) Foreign Application Priority Data

Nov. 11, 2009 (JP) ................................. 2009-257828

(51) Int. Cl.
*B01D 37/00* (2006.01)
*B67D 7/76* (2010.01)
*B01D 29/00* (2006.01)
*B01D 36/00* (2006.01)

(52) U.S. Cl.
USPC .................. 210/805; 210/167.01; 210/167.3; 210/172.1; 210/196; 210/206; 210/416.1; 222/1; 222/189.06; 222/189.09

(58) Field of Classification Search
None
See application file for complete search history.

(56) References Cited

U.S. PATENT DOCUMENTS

| 5,262,068 | A | 11/1993 | Bowers et al. | |
|---|---|---|---|---|
| 6,171,367 | B1 * | 1/2001 | Peng et al. | 95/46 |
| 6,183,223 | B1 | 2/2001 | Yajima | |
| 6,238,576 | B1 | 5/2001 | Yajima | |
| 6,539,986 | B2 * | 4/2003 | Yajima | 141/2 |
| 6,612,505 | B2 * | 9/2003 | Shyu | 239/11 |
| 6,733,250 | B2 * | 5/2004 | Yajima | 417/313 |
| 6,848,625 | B2 | 2/2005 | Takekuma et al. | |
| 7,594,801 | B2 * | 9/2009 | Udagawa | 417/53 |
| 7,708,880 | B2 * | 5/2010 | Yajima | 210/167.01 |
| 7,878,375 | B2 * | 2/2011 | Yajima | 222/318 |
| 7,887,305 | B2 * | 2/2011 | Yajima | 417/313 |
| 2001/0025890 | A1 | 10/2001 | Fujimoto et al. | |
| 2002/0014448 | A1 | 2/2002 | Uto et al. | |
| 2002/0041312 | A1 | 4/2002 | Yajima | |

(Continued)

FOREIGN PATENT DOCUMENTS

JP    2001127034 A    5/2001
JP    2007117787 A    5/2007

*Primary Examiner* — Robert James Popovics
(74) *Attorney, Agent, or Firm* — MKG, LLC (57) ABSTRACT

A chemical liquid supply device has a pump provided with a pump chamber which is expanded and contracted by an elastically deformable bellows, and chemical liquid in a chemical liquid container flows into the pump chamber through a suction channel. The chemical liquid in the pump chamber is discharged through a discharge channel to a discharge nozzle. A looped circulation channel for returning the chemical liquid supplied from the pump chamber to the pump chamber is connected to the pump, and provided with an expanding and contracting portion. A filter for filtering the chemical liquid which is returned to the pump chamber is provided to the circulation channel. Since flow resistance of the filter is not applied to the pump when the chemical liquid is discharged from a discharge nozzle, it's possible to discharge a specific amount of chemical liquid from the discharge nozzle with a high degree of accuracy.

5 Claims, 9 Drawing Sheets

(56) References Cited

U.S. PATENT DOCUMENTS

| | | | |
|---|---|---|---|
| 2002/0131875 A1* | 9/2002 | Yajima | 417/313 |
| 2004/0144736 A1 | 7/2004 | Yajima | |
| 2005/0175472 A1* | 8/2005 | Udagawa | 417/313 |
| 2005/0238504 A1 | 10/2005 | Yajima | |
| 2008/0011781 A1* | 1/2008 | Yajima | 222/146.1 |
| 2008/0087615 A1 | 4/2008 | Taniguchi et al. | |
| 2011/0174745 A1* | 7/2011 | Kim et al. | 210/791 |
| 2012/0241469 A1* | 9/2012 | Takeishi | 222/1 |

\* cited by examiner

Suctioning Step

*FIG. 3*

Filtering Step

FIG. 4

Returning Step

FIG. 5

Discharging Step

CHEMICAL LIQUID SUPPLY DEVICE AND CHEMICAL LIQUID SUPPLY METHOD

TECHNICAL FIELD

The present invention relates to a chemical liquid supply technology for applying chemical liquid such as photoresist liquid to an object such as semiconductor wafer.

BACKGROUND ART

In a process of manufacturing a semiconductor wafer, chemical liquids such as photoresist liquid, pure water and organic solvent are used, and these chemical liquids are applied to the semiconductor wafer. For example, when the photoresist liquid is applied to the semiconductor wafer, this chemical liquid in a chemical liquid container is suctioned by a pump, and discharged from a discharge nozzle. As a mode of pump for discharging the chemical liquid, there are a mode in which a resin-made tube expanding and contracting in a radial direction is used as a pump member and a pump chamber is formed in this tube as described in JP H10-61558, and a mode in which a resin-made bellows expanding and contracting in an axial direction is used as a pump member and a pump chamber is formed between the bellows and a case accommodating the bellows as described in JP 2002-113406. Furthermore, as a mode of pump, there is a mode in which a diaphragm is used as a pump member.

In this chemical liquid supply device, the chemical liquid is filtered by a filter to remove particles and air bubbles contained in the chemical liquid.

As a mode of arrangement of filter, there are a mode in which it is placed on a primary side of the pump, and a mode in which it is placed on a secondary side of the pomp as described in JP 2002-113406. In the mode where the filter is placed on the secondary side of the pump, the filter is placed between the pump and the discharge nozzle, and the chemical liquid is filtered by supplying the chemical liquid to the filter with discharge operation of the pump. On the other hand, in the mode where the filter placed on the primary side of the pump, the filter is placed between the chemical liquid container and the pump, and the chemical liquid is suctioned and supplied to the filter with suction operation of the pump for filtering.

In the mode of placing the filter on the secondary side of the pump, it is possible to reliably filter the chemical liquid. However, since the discharge operation and filtering operation are simultaneously performed, the discharge amount is varied due to flow resistance of the filter. In this way, when clogging occurs in the filter or air bubbles are accumulated in the filter, the flow resistance of the filter is increased, as a result, a discharge pressure of the pump is increased and the discharge amount is decreased simultaneously, so it is impossible to continuously discharge the chemical liquid from the discharge nozzle with the same accuracy for a long period of time. As such, when the flow rate and the discharge amount of the chemical liquid is changed due to a secondary factor in the filter, original discharge capabilities of the pump cannot be achieved in this mode.

On the other hand, in the mode of placing the filter on the primary side of the pump, since the filter is not placed on the secondary side of the pump, an influence of the clogged filter on the discharge accuracy is small. However, when the chemical liquid passes through the filter with the suction operation, the chemical liquid is placed in a negative pressure state, and bubbles generated from gas dissolved in the chemical liquid are mixed in the chemical liquid. As a result, a circuit pattern on a semiconductor wafer tends to have a defect, thereby increasing faulty products. In order to improve this situation, it is necessary to provide a system for removing air bubbles to the chemical liquid supply device, and it is inevitable that this device is complicated in configuration and increased in production cost.

As described in JP 3286687 and JP 2007117787, it is known that, in order to solve these problems, a filter is placed between two pumps in a chemical liquid supply device, the chemical liquid is supplied by a first pump from the chemical liquid container to the filter, and the filtered chemical liquid is passed into a second pump by suction.

However, if two pumps are provided to one chemical liquid supply line, the device becomes not only expensive and large in size, but also complex in pipe arrangement, control programs and the like. Furthermore, if a buffer tank is used between the filter and the second pump as described in JP 2007117787, since the surface of the chemical liquid accommodated in the buffer tank comes in contact with air, the chemical liquid contacted by air turns into a gel, and particles are mixed in the chemical liquid.

SUMMARY

An object of the present invention is to discharge a specific amount of chemical liquid from the discharge nozzle with a high degree of accuracy while removing air bubbles and foreign substances such as dust contained in the chemical liquid A chemical liquid supply device according to the present invention comprises: a suction channel connected to a pump provided with a pump chamber which is expanded and contracted by a pump member, wherein chemical liquid in a chemical liquid container flows into the pump chamber through the suction channel; a discharge channel connected between the pump and a discharge nozzle, wherein the discharge channel discharges the chemical liquid in the pump chamber to the discharge nozzle; and a circulation channel provided with an expanding and contracting portion in which the chemical liquid supplied from the pump chamber is temporarily stored, wherein an inflow portion and an outflow portion are connected to the pump, and the circulation channel returns the chemical liquid supplied from the pump chamber to the pump chamber, wherein a filter filtering the chemical liquid returned to the pump chamber through the circulation channel is provided in the circulation channel, and an operation of circulating the chemical liquid in the chemical liquid container through the circulation channel and an operation of discharging the filtered chemical liquid in the circulation channel to the discharge nozzle are performed by the pump.

In the chemical liquid supply device according to the present invention, the expanding and contracting portion is a tank forming an expanding and contracting chamber with an elastically deformable tank member. The chemical liquid supply device according to the present invention comprises discharge valve means opening the discharge channel when the pump chamber is contracted to discharge the chemical liquid in the pump chamber to the discharge nozzle, suction valve means opening the suction channel when the pump chamber is expanded to cause the chemical liquid in the chemical liquid container to flow into the pump chamber, circulation valve means opening the inflow portion of the circulation channel when the chemical liquid in the pump chamber is supplied to the circulation channel, and return valve means opening the outflow portion of the circulation channel when the chemical liquid filtered by the filter is returned to the pump chamber.

In a chemical liquid supply device having a suction channel through which a pump chamber and a chemical liquid container are connected, the pump chamber being partitioned by a pump member mounted in a pump to expand and contract, a circulation channel provided with an expanding and contracting portion in which a chemical liquid supplied from the pump chamber is temporarily stored, the circulation channel returning the chemical liquid supplied from the pump chamber to the pump chamber, and a discharge channel through which the pump chamber and a discharge nozzle are connected, the chemical liquid supply method according to the present invention discharges the chemical liquid in the chemical liquid container to the discharge nozzle, the chemical liquid supply method comprising: a suctioning step of expanding the pump chamber with the suction channel being opened and causing the chemical liquid in the chemical liquid container to flow into the pump chamber; a filtering step of contracting the pump chamber with an inflow portion of the circulation channel being opened and filtering the chemical liquid supplied from the pump chamber by a filter; a returning step of expanding the pump chamber with an outflow portion of the circulation channel being opened and suctioning the filtered chemical liquid returned from the circulation channel to the pump chamber; and a discharging step of contracting the pump chamber with the discharge channel being opened and discharging the filtered chemical liquid in the pump chamber to the discharge nozzle, wherein an operation of circulating the chemical liquid in the chemical liquid container through the circulation channel and an operation of discharging the filtered chemical liquid in the circulation channel to the discharge nozzle are preformed by the pump. In the chemical liquid supply method according to the present invention, the expanding and contracting portion is a tank forming an expanding and contracting chamber with an elastically deformable tank member.

According to the present invention, since the filter filtering chemical liquid is provided in the circulation channel for returning the chemical liquid supplied from the pump chamber to the pump chamber, and the discharge channel for discharging the filtered chemical liquid from the pump chamber to the discharge nozzle is separated as another branch from the circulation channel, when the chemical liquid is discharged from the discharge nozzle, flow resistance having it pass through the filter is not applied to the pump. With this, when the chemical liquid is discharged from the pump to the discharge nozzle, it is possible to set discharge amount and flow rate of the chemical liquid with a high degree of accuracy.

Since the chemical liquid is pressurized by the pump chamber so as to supply the chemical liquid to the filter at the time of having the chemical liquid pass through the filter provided to the circulation channel and filtering the chemical liquid, the chemical liquid is not placed in a negative pressure state at the time of filtering it, thereby preventing air bubbles from being produced the chemical liquid. With this, it is not necessary to provide a system for removing air bubbles to the chemical liquid supply device. Also, the chemical liquid can be filtered at a flow velocity appropriate for filtering operation and different from a discharge flow velocity.

DETAILED DESCRIPTION

Figure 1:
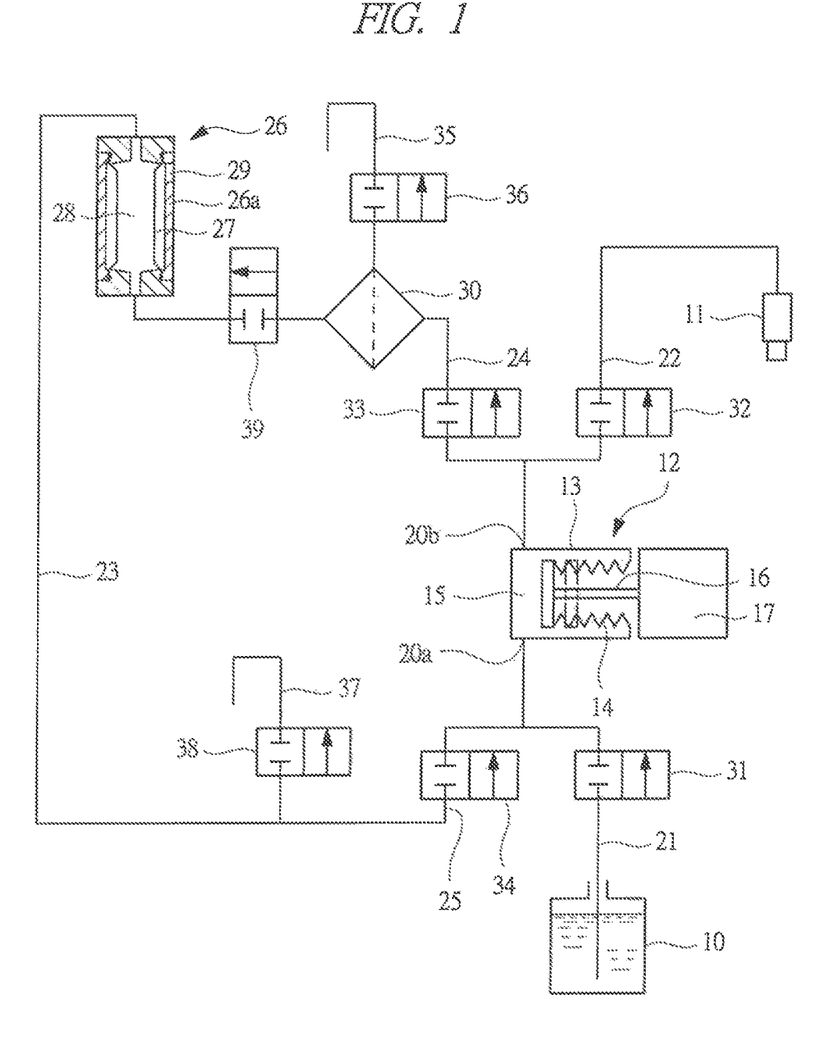
FIG. 1 is a chemical liquid circuit diagram showing a chemical liquid supply device according to one embodiment of the present invention.

Hereinafter, embodiments of the present invention will be described in detail with reference to the drawings. As shown in FIG. 1, this chemical liquid supply device is used to discharge chemical liquid accommodated in a chemical liquid container 10 from a discharge nozzle 11 to apply to an object (not shown). For example, a semiconductor wafer is taken as an object, and the device is used to apply photoresist liquid as chemical liquid to this object.

A pump 12 for supplying the chemical liquid to the object has a pump case 13 and an elastically deformable bellows 14 incorporated in this case, and a pump chamber 15 is partitioned by this bellows 14 and the pump case 13. A driving mechanism 17 making a driving shaft 16 reciprocate in an axial direction is mounted on the pump case 13, and this driving mechanism 17 has an electric motor and a converting portion which converts a rotational movement of a motor main shaft to an axial movement. When the bellows 14 is elastically deformed in the axial direction by driving the driving mechanism 17, the pump chamber 15 is expanded and contracted. As driving means for driving the bellows 14 as a pump member, a fluid-pressure cylinder such as pneumatic cylinder, hydraulic cylinder, and the like may be used in place of the driving mechanism having the electric motor.

The pump 12 has a primary-side port 20a connected to a suction channel 21, and this suction channel 21 communicates with the pump chamber 15. The suction channel 21 has an end placed in the chemical liquid container 10 having the chemical liquid accommodated therein, and the chemical liquid in the chemical liquid container 10 flows into the pump chamber 15 through the suction channel 21. A discharge channel 22 is connected to a secondary-side port 20b of the pump 12 so as to communicate with the pump chamber 15. This discharge channel 22 has a tip portion provided with the discharge nozzle 11, and the chemical liquid in the pump chamber 15 is discharged through the discharge channel 22 to the discharge nozzle 11. The primary-side port 20a is provided to a lower portion of the pump case 13, and the secondary-side port 20b is provided to an upper portion of the pump case 13.

The pump 12 is provided with a looped circulation channel 23 for returning the chemical liquid supplied from the pump chamber 15 to the pump chamber 15. The circulation channel 23 has an inflow portion 24 connected to the secondary-side port 20b of the pump 12 to communicate with the pump chamber 15, and the circulation channel 23 has an outflow portion 25 connected to the primary-side port 20a of the pump 12 to communicate with the pump chamber 15. As shown in FIG. 1, the suction channel 21 and the outflow portion 25 communicate with the primary-side port 20a through a common channel where these meet, and the discharge channel 22 and the inflow portion 24 communicate with the secondary-side port 20b through a common channel where these meet. However, each channel may separately communicate with the pump chamber.

The circulation channel 23 is provided with an expanding and contracting portion 26. This expanding and contracting portion 26 has a tube member 26a made of rigid material, and a flexible tube 27 which is elastically deformable in a radial direction is incorporated as an elastically deformable member in this tube member 26a. The flexible tube 27 has a communication hole 28 through which the chemical liquid flows, and when the chemical liquid is supplied from the pump 12 to the circulation channel 23, the flexible tube 27 is expanded by the supplied chemical liquid, and the chemical liquid is temporarily stored in the expanded communication hole 28. On the other hand, when the chemical liquid is returned from the circulation channel 23 to the pump chamber 15, the flexible tube 27 is contracted. In the tube member 26a, a breather hole 29 is formed for making a space between the tube member 26a and the flexible tube 27 communicate with the outside when the flexible tube 27 is elastically deformed in the radial direction. As such, the flexible tube 27 as an elastically deformable member according to the amount of chemical liquid to be supplied to the circulation channel 23 constitutes a tank member expanding and contracting in the radial direction, and the communication hole 28 constitutes an expanding and contracting chamber.

The circulation channel 23 is provided with a filter 30 which is located on its position upper stream side from the expanding and contracting portion 26, and adapted to filter the chemical liquid flowing through the circulation channel 23. With this, the chemical liquid supplied from the pump chamber 15 to the circulation channel 23 is filtered by the filter 30, and then is supplied to the flexible tube 27, thereby causing the filtered and purified chemical liquid to be returned to the pump chamber 15.

The suction channel 21 is provided with a channel open/close valve 31 as suction valve means for opening the suction channel 21 when the chemical liquid in the chemical liquid container 10 flows into the pump chamber 15 by contracting the bellows 14 in the axial direction to expand the pump chamber 15. The discharge channel 22 is provided with a channel open/close valve 32 as discharge valve means for opening the discharge channel 22 when the chemical liquid in the pump chamber 15 is discharged to the discharge nozzle 11 by contracting the pump chamber 15. The inflow portion 24 of the circulation channel 23 is provided with a channel open/close valve 33 as circulation valve means for opening the inflow portion 24 when the chemical liquid in the pump chamber 15 is supplied to the circulation channel 23. The outflow portion 25 of the circulation channel 23 is provided with a channel open/close valve 34 as return valve means for opening the outflow portion 25 when the chemical liquid filtered by the filter 30 is returned to the pump chamber 15.

When the suction channel 21 is opened by the channel open/close valve 31 to cause the chemical liquid in the chemical liquid container 10 to flow into the pump chamber 15, the other channels are closed by the channel open/close valves 32, 33, and 34. When the discharge channel 22 is opened by the channel open/close valve 32 to discharge the chemical liquid in the pump chamber 15 to the discharge nozzle 11, the other channels are closed by the channel open/close valves 31, 33, and 34. When the inflow portion 24 is opened by the channel open/close valve 33 to supply the chemical liquid in the pump chamber 15 to the circulation channel 23, the other channels are closed by the channel open/close valves 31, 32, and 34. Furthermore, when the outflow portion 25 is opened by the channel open/close valve 34 to return the filtered chemical liquid to the pump chamber 15, the other channels are closed by the channel open/close valves 31, 32, and 33.

Each of the channel open/close valves 31 to 34 is a two-position switching valve which is operated by a solenoid to switch between a position for opening a channel and a position for closing the channel, and a channel opening/closing operation is performed by sending a driving signal to the solenoid. However, each of the channel open/close valves may have a fluid operating type in which a spool valve is driven by fluid pressure without using an electromagnetic valve.

The filter 30 is connected to an exhaust channel 35 for discharging gas captured by the filter 30 to the outside, and this exhaust channel 35 is provided with a channel open/close valve 36 for opening and closing the channel. Also, an exhaust channel 37 is connected to a downstream side portion of the circulation channel 23 to discharge gas in the circulation channel 23 to the outside, and this exhaust channel 37 is provided with a channel open/close valve 38 for opening and closing the channel. The circulation channel 23 between the filter 30 and the expanding and contracting portion 26 is provided with a channel open/close valve 39 for opening and closing the channel.

Portions such as the above described bellows 14 and flexible tube 27 with which the chemical liquid is in contact are formed of fluororesin so as not to react with the photoresist liquid as chemical liquid. However, depending on the type of the chemical liquid, rubber, another resin, or metal may be used in place of fluororesin.

Next, a process of applying the chemical liquid to the object by the above described chemical liquid supply device will be described with reference to FIGS. 2 to 5.

Figure 2:
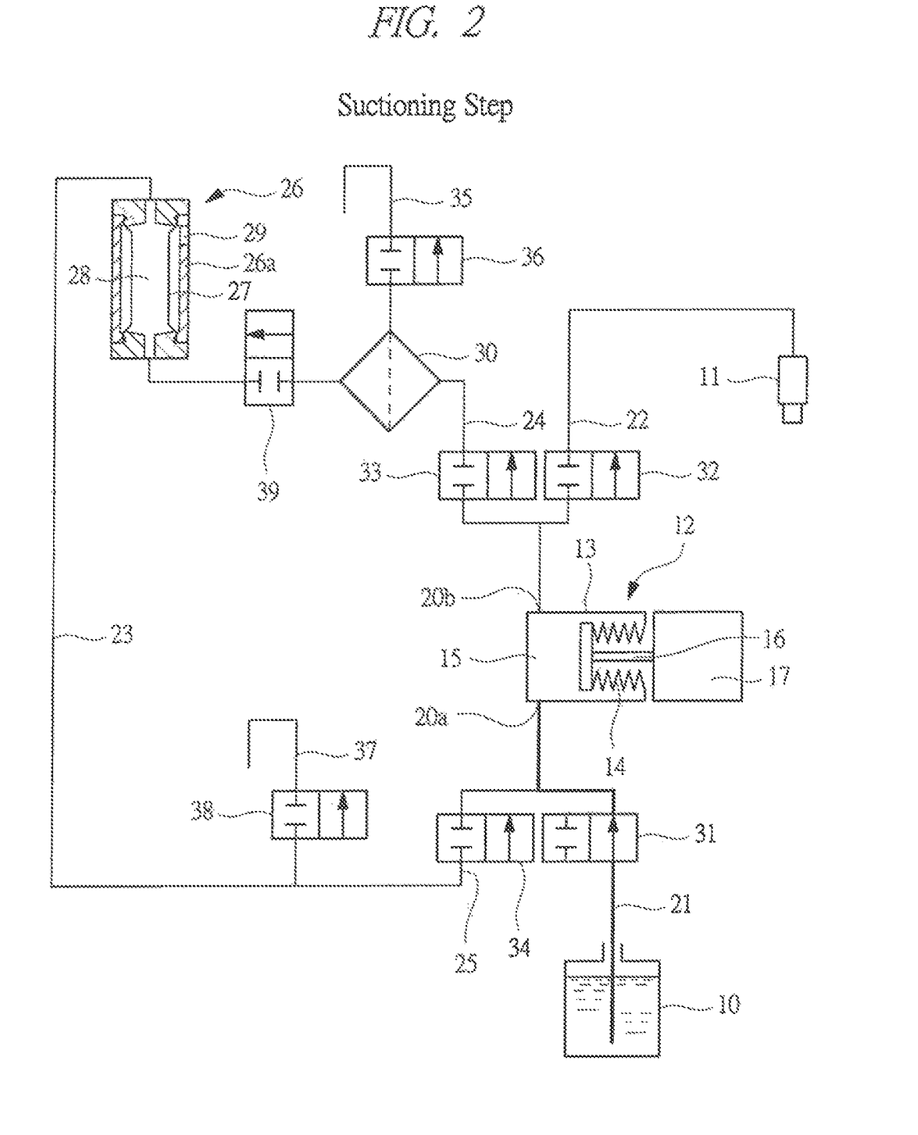
FIG. 2 is a chemical liquid circuit diagram showing a state in which it is in a suctioning process.

At the time of applying the chemical liquid, by firstly supplying the chemical liquid in the chemical liquid container 10 to the circulation channel 23 to filter the chemical liquid by the filter 30, the chemical liquid circulated through the circulation channel 23 and filtered by the filter 30 is applied to the object. To filter the chemical liquid, in a state where the bellows 14 is expanded to contract the pump chamber 15 as indicated by a solid line in FIG. 1, a suctioning process is executed as shown in FIG. 2. In this suctioning process, in a state where the suction channel 21 is opened by operating the channel open/close valve 31, the driving mechanism 17 of the pump 12 is driven to contract the bellows 14 to expand the pump chamber 15. With this, the chemical liquid in the chemical liquid container 10 flows toward the pump chamber 15.

Figure 3:
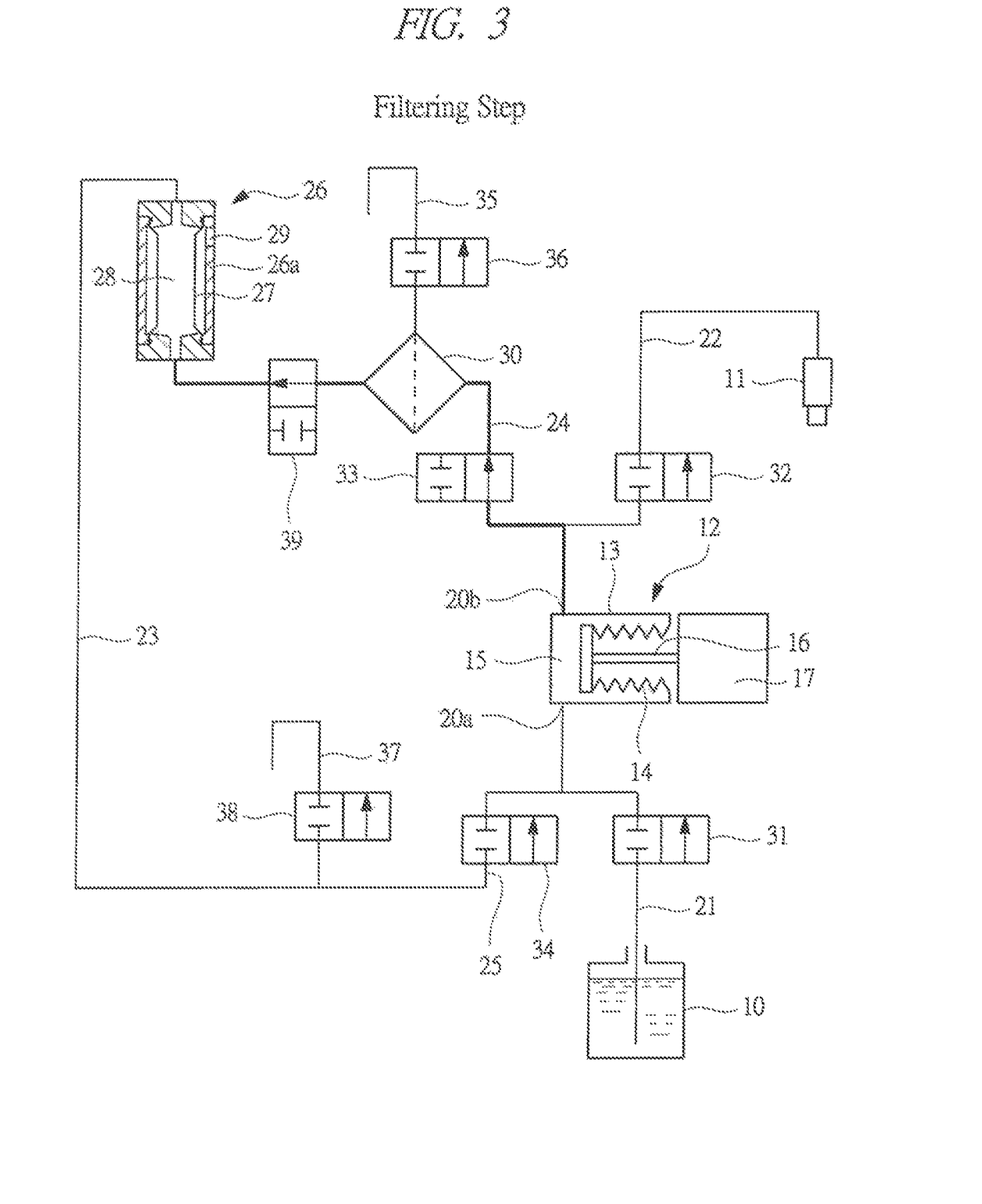
FIG. 3 is a chemical liquid circuit diagram showing a state in which it is in a filtering process.

Next, a filtering process is executed as shown in FIG. 3. In the filtering process, in a state where the inflow portion 24 of the circulation channel 23 is opened by the channel open/close valve 33, and the filter 30 and the communication hole 28 of the expanding and contracting portion 26 communicates with each other through the channel open/close valve 39, the electric motor of the driving mechanism 17 of the pump 12 is reversely rotated so as to expand the bellows 14, thereby contracting the pump chamber 15. With this, the chemical liquid in the pump chamber 15 is sent to the filter 30 through the circulation channel 23 and filtered by the filter 30, and the filtered chemical liquid flows toward the flexible tube 27 provided to the expanding and contracting portion 26, thereby expanding the flexible tube 27 with the chemical liquid supplied into the circulation channel 23. The chemical liquid entering the inside of the expanded communication hole 28 is temporarily stored with the expansion of the flexible tube 27 as a tank, thereby preventing the chemical liquid from coming in contact with outside air. In this filtering process, since the pump chamber 15 is contracted by the bellows 14 to pressurize the chemical liquid to supply the chemical liquid to the filter 30, the chemical liquid is not placed in a negative pressure state, and air bubbles is prevented from being produced from air dissolved in the chemical liquid at the time of filtering the chemical liquid and mixed into the chemical liquid. As shown in figures, since the secondary-side port 20b is provided on the side upper than the primary-side port 20a, even if air bubbles mixed in the chemical liquid container 10 flow into the pump chamber 15, the air bubbles flow toward the filter 30 without stopping in the pump chamber 15.

Figure 4:
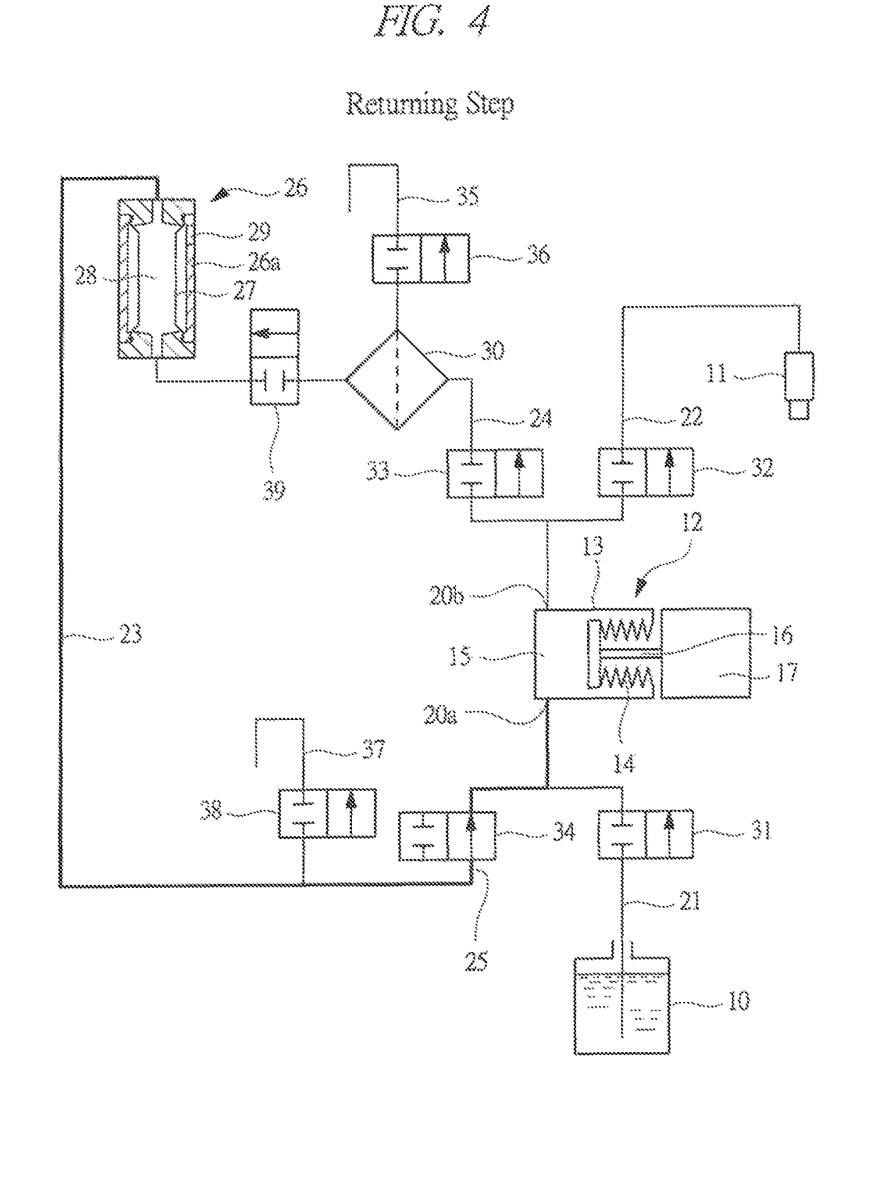
FIG. 4 is a chemical liquid circuit diagram showing a state in which it is in a returning process.

The chemical liquid passed through and filtered by the filter 30 is returned to the pump chamber 15 in a returning process shown in FIG. 4. In this returning process, in s state where the outflow portion 25 of the circulation channel 23 is opened by the channel open/close valve 34 and communication between the filter 30 and the communication hole 28 of the expanding and contracting portion 26 is shut off by the channel open/close valve 39, the pump chamber 15 is expanded to return the chemical liquid in the circulation channel 23 to the pump chamber 15. At this time, with the expansion of the pump chamber 15, the flexible tube 27 expanded in the expanding and contracting portion 26 is contracted in the radial direction. As described above, before being applied from the discharge nozzle 11, the chemical liquid in the chemical liquid container 10 is passed through the circulation channel 23, thereby being filtered by the filter 30, and therefore, air bubbles and foreign substances such as dust contained in the chemical liquid are removed for purification of the chemical liquid.

To enhance the purification of the chemical liquid, a process of repeating the filtering process shown in FIG. 3 and the returning process shown in FIG. 4 to increase the number of circulation is performed.

At the end of the returning process, the filtered chemical liquid is accommodated in the expanded and enlarged pump chamber 15. With this state, when the outflow portion 25 is closed by the channel open/close valve 34, the chemical liquid supply device takes a standby state as shown in FIG. 1. At this time, the bellows 14 is in a contracted state as shown in two-dot-chain lines.

Figure 5:
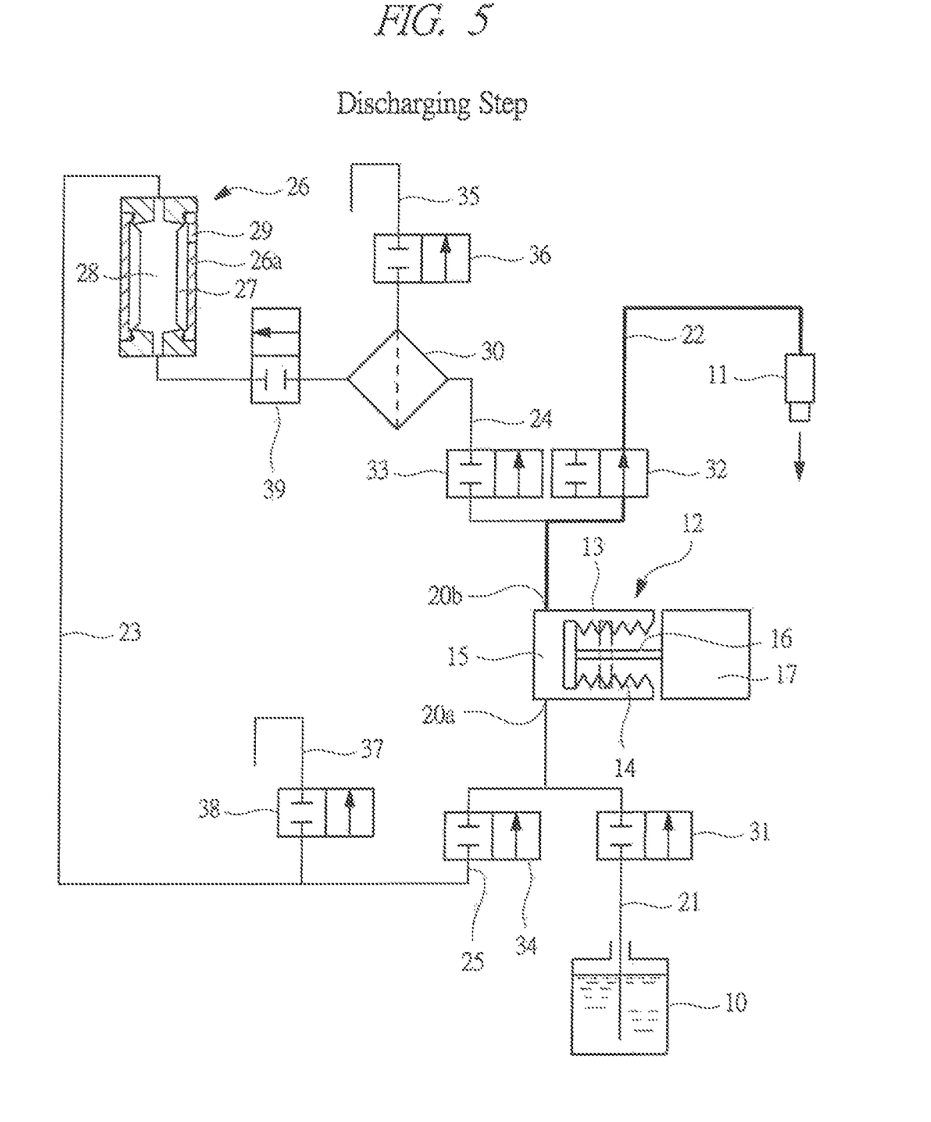
FIG. 5 is a chemical liquid circuit diagram showing a state in which it is in a discharging process.

To apply the chemical liquid to the object, a discharging process shown in FIG. 5 is executed. In this discharging process, in a state where the discharge channel 22 is opened by the channel open/close valve 32, the pump chamber 15 is contracted to discharge the filtered chemical liquid in the pump chamber 15 toward the discharge nozzle 11. When the capacity of the pump chamber 15 is set to be larger than the amount of the chemical liquid discharged at a time from the discharge nozzle 11 to the object, the discharging process can be successively performed a plurality of times.

In order to prevent the chemical liquid remaining in its tip from dropping as droplets from the discharge nozzle 11 to the object after the chemical liquid is applied to the object, a suck-back process may be executed. At this time, as shown in FIG. 5, with the discharge channel 22 being opened, the pump chamber 15 is slightly expanded. With this, the chemical liquid remaining in the tip of the discharge nozzle 11 is slightly returned to prevent the chemical liquid from dropping to the object. In this suck-back operation, no filter is provided to the discharge channel 22, and no flow resistance is applied to the chemical liquid in the discharge channel 22. Therefore, the suck-back amount of the chemical liquid can be set by the amount of expansion of the pump chamber 15 with a high degree of accuracy.

When the pump chamber 15 is contracted to its limit and the chemical liquid to be applied to the object is consumed from the inside of the pump chamber 15, the suctioning process shown in FIG. 2, the filtering process shown in FIG. 3, and the returning process shown in FIG. 4 are repeated.

As shown in FIGS. 1 to 5, in the chemical liquid supply device of the present invention, the operation of filtering the chemical liquid by causing the chemical liquid to flow through the circulation channel 23 for the purification of the chemical liquid by the filter 30 and the discharge operation of causing the chemical liquid to be discharged from the discharge nozzle 11 are performed through channels of separate systems. And, to the channels of the separate systems, the chemical liquid is supplied by one pump 12. As such, when the operation of filtering the chemical liquid and the discharge operation are performed by the channels of the separate systems, at the time of driving the bellows 14 by the driving mechanism 17 to discharge the chemical liquid from the discharge nozzle 11, no passage resistance of the filter 30 is received, and therefore the discharge amount and the flow rate from the discharge nozzle 11 can be accurately kept. Also, since the filter 30 is provided to the circulation channel 23 and the chemical liquid is pressurized by the pump 12 to the filter 30 for supply, when the chemical liquid is filtered by the filter 30, the chemical liquid does not become in a negative pressure state. With this, gas dissolved in the chemical liquid can be prevented from becoming air bubbles. Moreover, since the chemical liquid can be supplied to the channels of two systems by one pump 12, the chemical liquid supply device can be prevented from becoming complex. Furthermore, since the filtering system and the discharging system are separate systems, a flow velocity of the chemical liquid at the time of the discharge operation and a flow velocity of the chemical liquid at the time of the filtering operation can made different from each other.

Each of the processes shown in FIGS. 2 to 5 is performed in a state where all channels including the circulation channel 23 are filled with the chemical liquid. Therefore, when the chemical liquid supply device is started and operated, all channels are filled with the chemical liquid to discharge air in the channels to the outside. At this time, by using the exhaust channels 35 and 37, air in the filter 30 and the circulation channel 23 is discharged to the outside. For example, to supply the chemical liquid into the filter 30, the channel open/close valves 31, 33, and 36 being opened and the other channel open/close valves being closed, the chemical liquid is supplied by the pump 12 into the filter 30. With this, the inside of the filter 30 is filled with the chemical liquid from the suction channel 21, and air in the filter 30 is discharged from the exhaust channel 35 to the outside. Air in the circulation channel 23 is discharged from the exhaust channel 37 to the outside by supplying the chemical liquid from the pump 12 to the circulation channel 23. As such, with air bubbles being removed from the inside of all channels, the chemical liquid is applied by the chemical liquid supply device to the object.

Figure 6:
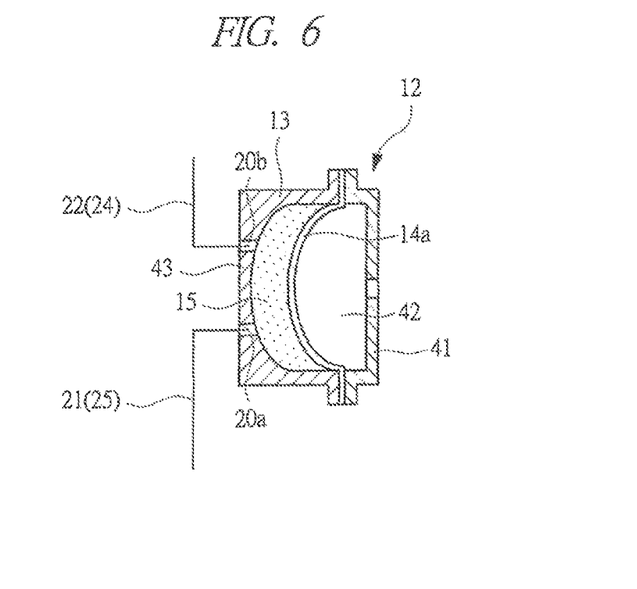
FIG. 6 is a sectional view showing another specific example of the pump.

FIG. 6 is a sectional view showing another specific example of the pump. While the pump 12 shown in FIG. 1 is of a type with the bellows 14 having an accordion portion being taken as a pump member, FIG. 6 shows a pump 12 of a type with a diaphragm 14a being taken as a pump member. The diaphragm 14a is in a state being interposed between the pump case 13 and a cover 41, and the diaphragm 14a and the pump case 13 form the pump chamber 15. The cover 41 and the diaphragm 14*a* form a pressurizing chamber 42. When the diaphragm 14*a* is elastically deformed by supplying and discharging a pressurized fluid from the outside to the pressurizing chamber 42, the pump chamber 15 is expanded and contracted. However, as with the case shown in FIG. 1, the diaphragm 14*a* may be elastically deformed by an electric motor or a fluid pressure cylinder.

The suction channel 21 and the outflow portion 25 are connected to the primary-side port 20*a* formed on the pump case 13 communicating with this pump chamber 15, and the discharge channel 22 and the inflow portion 24 are connected to the secondary-side port 20*b* formed on the pump case 13. By placing the secondary-side port 20*b* on a side upper than the primary-side port 20*a*, air bubbles entering the inside of the pump chamber 15 can be discharged outside the pump.

Figure 7:
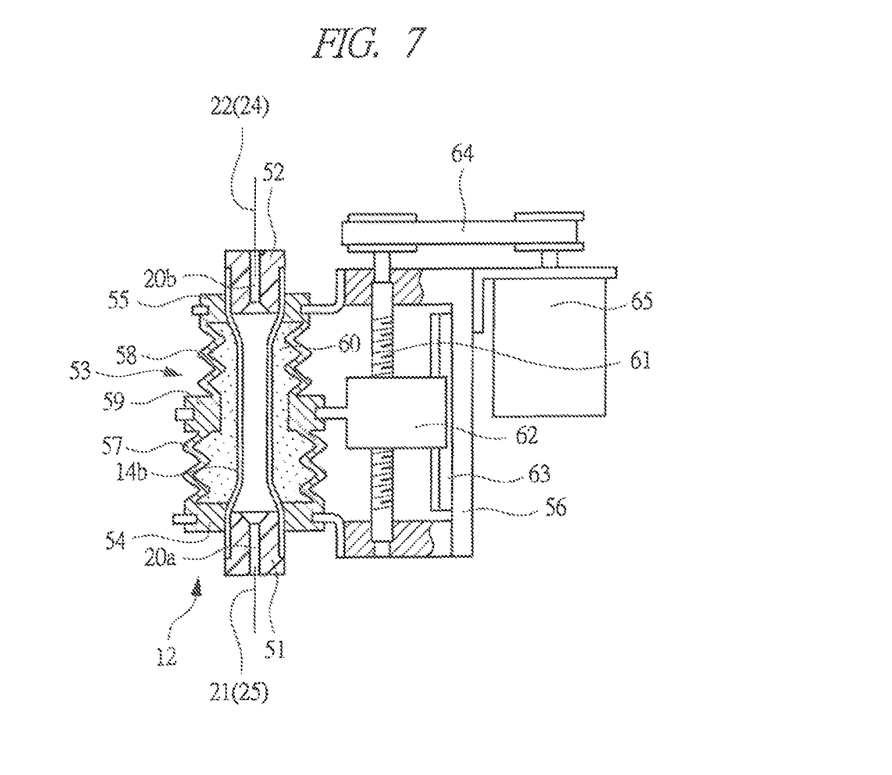
FIG. 7 is a sectional view showing still another specific example of the pump.

FIG. 7 is a sectional view of still another specific example of the pump, showing a pump 12 with the tube described in Patent Document 1 as a pump member. A tube 14*b* as a pump member is placed as being vertically oriented, and has its lower end provided with a primary-side adaptor 51 having formed therein the primary-side port 20*a*. The suction channel 21 and the outflow portion 25 are connected to this primary-side adaptor 51. The tube 14*b* has an upper end provided with a secondary-side adaptor 52 having formed therein the secondary-side port 20*b*. The discharge channel 22 and the inflow portion 24 are connected to this secondary-side adaptor 52. Outside of the tube 14*b*, a bellows 53 is mounted, and this bellows 53 has a fixed disk portion 54 fixed to the adaptor 51 through one end of the tube 14*b* and a fixed disk portion 55 fixed to the adaptor 52 through another end of the tube 14*b*. Each of the fixed disk portions 54 and 55 are fixed to a supporting frame 56.

To the fixed disk portion 54, a large-sized bellows portion 57 is integrally provided. To the fixed disk portion 55, a small-sized bellows portion 58 is integrally provided, having a change in capacity per unit displacement amount in the axial direction smaller than that of the large-sized bellows portion 57. Between the large-sized bellows portion 57 and the small-sized bellows portion 58, an operating disk portion 59 provided integrally therewith. Between the tube 14*b* and the bellows 53, a driving chamber 60 in which an incompressible medium is enclosed is formed. On the supporting frame 56, a ball screw shaft 61 is rotatably mounted along the bellows 53. A ball nut 62 screw-bonded to the ball screw shaft 61 is mounted on a guide rail 63 provided on the supporting frame 56 so as to be able to reciprocate in the axial direction. The ball screw shaft 61 is driven by rotation by an electric motor 65 through a pulley 64. When the operating disk portion 59 is displaced in the axial direction by rotating the ball screw shaft 61, the capacity of the driving chamber 60 is changed to cause the tube 14*b* to expand and contract in the radial direction through the incompressible medium in the driving chamber 60.

Figure 8:
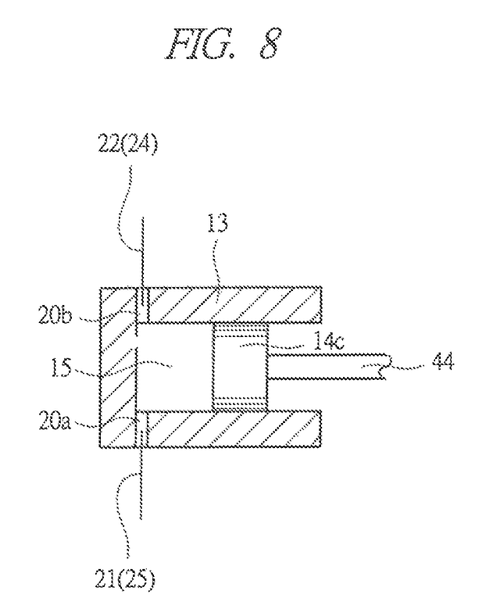
FIG. 8 is a sectional view showing yet another specific example of the pump.

FIG. 8 is a sectional view of still another specific example of the pump. This pump has the pump case 13 formed of a closed-bottom cylindrical cylinder. In this pump case 13, a pump member formed of a piston 14*c* is mounted so as to be able to reciprocate in the axial direction. With this piston 14*c*, the pump chamber 15 is formed in the pump case 13. The piston 14*c* is mounted at the tip of a driving rod 44, and the driving rod 44 is driven by the driving means such as an air-pressured cylinder or an electric motor to cause the piston 14*c* to reciprocate.

As described above, as a pump member expanding and contracting the pump chamber 15, there are a type using the bellows 14 as shown in FIG. 1, a type of using the diaphragm 14*a* as shown in FIG. 6, a type using the tube 14*b* as shown in FIG. 7, and a type using the piston 14*c* as shown in FIG. 8, any type of pump can be used as long as the type is such that the pump chamber 15 is expanded and contracted by a driving means.

On the other hand, in the circulation channel 23, in order to temporarily store the chemical liquid filtered by the filter 30, an elastically deformable tube, that is, the flexible tube 27 forms part of the circulation channel 23, as a tank member, but the entire circulation channel 23 may be constituted of a member elastically deformable in the radial direction. Furthermore, the diaphragm or the bellows may be made as an elastically deformable tank member forming an expanding and contracting chamber, and a tank having this tank member may be branched to the circulation channel 23 for connection.

Figure 9:
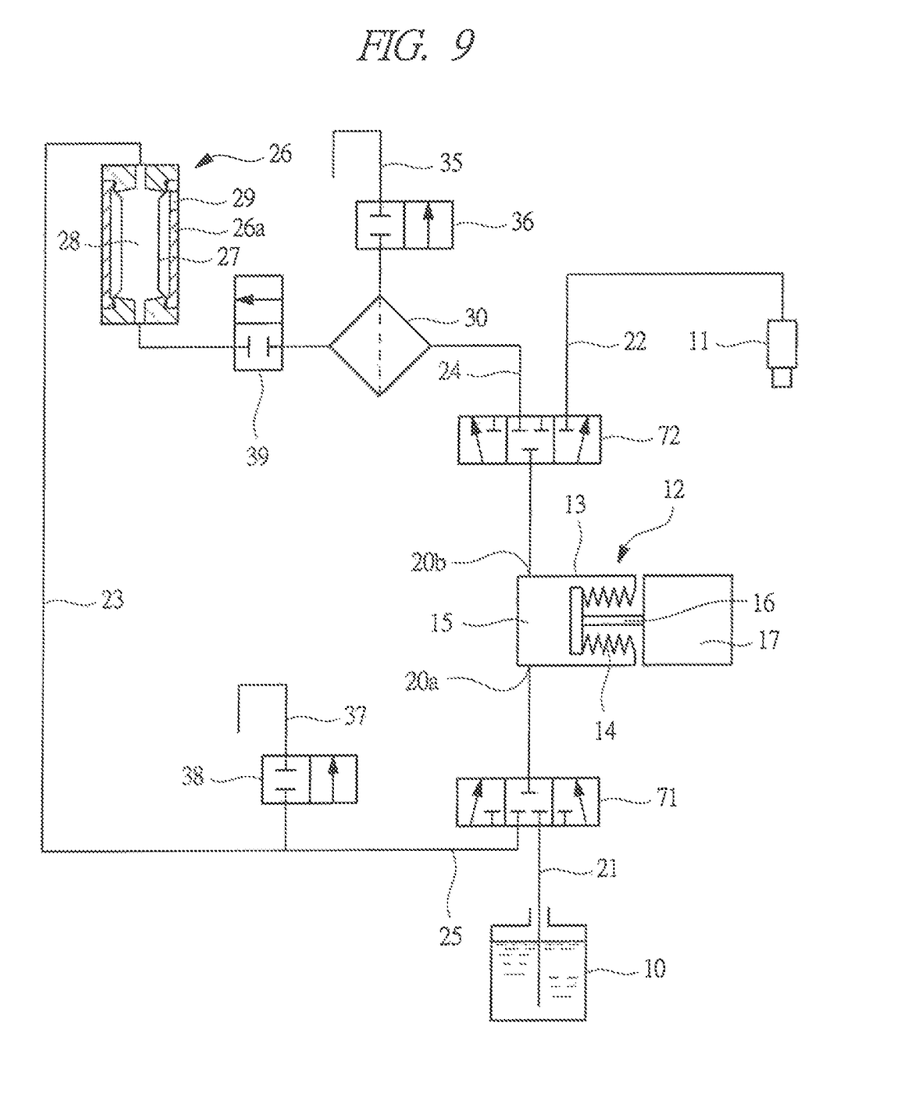
FIG. 9 is a chemical liquid circuit diagram showing a chemical liquid supply device according to another embodiment of the present invention.

FIG. 9 is a chemical liquid circuit diagram showing a chemical liquid supply device according to another embodiment of the present invention. In the chemical liquid supply device shown in FIG. 9, each of the suction channel 21 and the outflow portion 25 of the circulation channel 23 are connected through a channel switching valve 71 formed of a three-position switching valve to the primary-side port 20*a* of the pump 12. This channel switching valve 71 is switched among three positions including a position for shutting off the communication of both of the suction channel 21 and the outflow portion 25 with the primary-side port 20*a*, a position for causing the primary-side port 20*a* to communicate with the suction channel 21, and a position for causing the primary-side port 20*a* to the outflow portion 25.

Similarly, each of the discharge channel 22 and the inflow portion 24 of the circulation channel 23 is connected through a channel switching valve 72 formed of a three-position switching valve to the secondary-side port 20*b* of the pump 12. This channel switching valve 72 is switched among three positions including a position for shutting off the communication of both of the discharge channel 22 and the inflow portion 24 with the secondary-side port 20*b*, a position for causing the secondary-side port 20*b* to communicate with the discharge channel 22, and a position for causing the secondary-side port 20*b* to the inflow portion 24.

In the chemical liquid supply device shown in FIG. 9, the channel switching valve 71 constitutes suction valve means opening the suction channel 21 when the pump chamber 15 is expanded when the chemical liquid in the chemical liquid container 10 flows into the pump chamber 15 and return valve means opening the outflow portion 25 of the circulation channel 23 when the chemical liquid filtered by the filter 30 is returned to the pump chamber 15. On the other hand, the channel switching valve 72 constitutes discharge valve means opening the discharge channel 22 when the pump chamber 15 is contracted to discharge the chemical liquid in the pump chamber 15 to the discharge nozzle 11 and circulation valve means opening the inflow portion 24 of the circulation channel 23 when the chemical liquid in the pump chamber 15 is supplied to the circulation channel 23.

Figure 10:
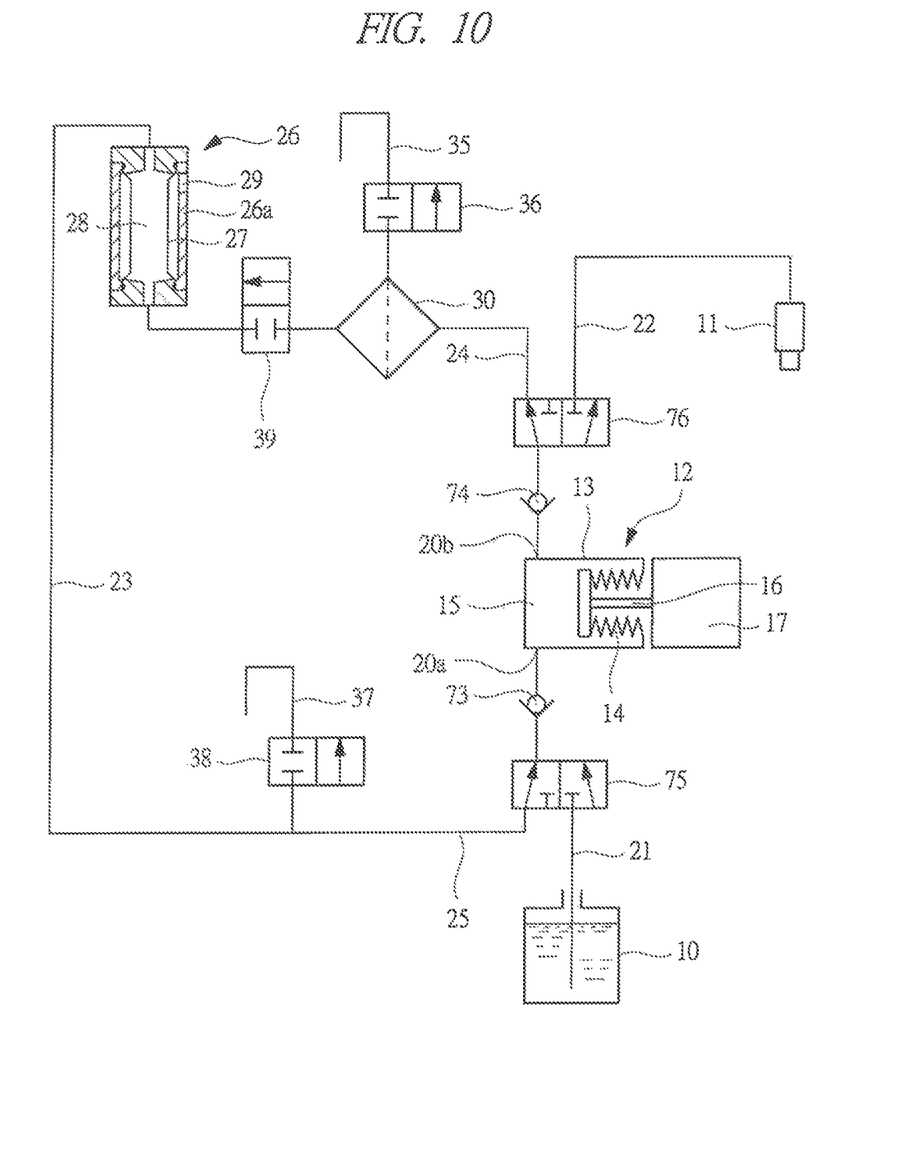
FIG. 10 is a chemical liquid circuit diagram showing a chemical liquid supply device according to still another embodiment of the present invention.

FIG. 10 is a chemical liquid circuit diagram of a chemical liquid supply device according to still another embodiment of the present invention. In the chemical liquid supply device shown in FIG. 10, a check valve 73 allowing a flow of the chemical liquid in a direction to the pump chamber 15 and inhibiting a flow in a reverse direction is connected to the primary-side port 20*a*, and a check valve 74 allowing a flow of the chemical liquid in a direction of discharging from the pump chamber 15 and inhibiting a flow in a reverse direction is connected to the secondary-side port 20*b*. The suction channel 21 and the outflow portion 25 of the circulation channel 23 are each connected to the check valve 73 through a channel switching valve 75 formed of a two-position switching valve. This channel switching valve 75 is switched between a position for causing the suction channel 21 and the check valve 73 to communicate with each other and a position for causing the outflow portion 25 to communicate with the check valve 73. On the other hand, a channel switching valve 76 is switched between a position for causing the discharge channel 22 and the check valve 74 to communicate with each other and a position for causing the inflow portion 24 and the check valve 74 to communicate with each other.

In the chemical liquid supply device shown in FIG. 10, the check valve 73 and the channel switching valve 75 constitute suction valve means and return valve means. On the other hand, the check valve 74 and the channel switching valve 76 constitute discharge valve means and circulation valve means. Also, in the chemical liquid supply device shown in FIGS. 9 and 10, as a type of the pump 12, not only the type of taking the bellows 14 as a pump member but also any of the type of taking the diaphragm 14a as a pump member, the type of taking the tube 14b as a pump member, and the type of taking the piston 14c as a pump member may be used. Furthermore, while each of the channel switching valves 71, 72, 75, and 76 shown in FIGS. 9 and 10 is formed of an electromagnetic valve which is operated by a solenoid, as with the channel open/close valves 31 to 34, they may have a fluid operating type in which a spool valve body is driven by fluid pressure in place of an electromagnetic valve.

The present invention is not limited to the embodiments described above, and it can be variously changed within a range not deviating from the gist of the invention. For example, while the chemical liquid supply device shown in figures is used to apply photoresist liquid to a semiconductor wafer, it can be used to apply organic solvent or pure water to an object in a liquid-crystal board manufacturing process or a magnetic disk manufacturing process.

The chemical liquid supply technology of the present invention is applied for applying chemical liquid such as photoresist liquid to an object.

What is claimed is:

1. A chemical liquid supply device comprising:
    a suction channel connected to a pump provided with a pump chamber which is expanded and contracted by a pump member, wherein chemical liquid in a chemical liquid container flows into the pump chamber through the suction channel;
    a discharge channel connected between the pump and a discharge nozzle, wherein the discharge channel discharges the chemical liquid in the pump chamber to the discharge nozzle; and
    a circulation channel provided with an expanding and contracting portion in which the chemical liquid supplied from the pump chamber is temporarily stored, wherein an inflow portion and an outflow portion are connected to the pump, and the circulation channel returns the chemical liquid supplied from the pump chamber to the pump chamber,
    wherein a filter filtering the chemical liquid returned to the pump chamber through the circulation channel is provided in the circulation channel, and
    an operation of circulating the chemical liquid in the chemical liquid container through the circulation channel and an operation of discharging the filtered chemical liquid in the circulation channel to the discharge nozzle are preformed by the pump.

2. The chemical liquid supply device according to claim 1, wherein the expanding and contracting portion is a tank forming an expanding and contracting chamber with an elastically deformable tank member.

3. The chemical liquid supply device according to claim 1, which comprises discharge valve means opening the discharge channel when the pump chamber is contracted to discharge the chemical liquid in the pump chamber to the discharge nozzle, suction valve means opening the suction channel when the pump chamber is expanded to cause the chemical liquid in the chemical liquid container to flow into the pump chamber, circulation valve means opening the inflow portion of the circulation channel when the chemical liquid in the pump chamber is supplied to the circulation channel, and return valve means opening the outflow portion of the circulation channel when the chemical liquid filtered by the filter is returned to the pump chamber.

4. A chemical liquid supply method in a chemical liquid supply device having a suction channel through which a pump chamber and a chemical liquid container are connected, the pump chamber being partitioned by a pump member mounted in a pump to expand and contract, a circulation channel provided with an expanding and contracting portion in which a chemical liquid supplied from the pump chamber is temporarily stored, the circulation channel returning the chemical liquid supplied from the pump chamber to the pump chamber, and a discharge channel through which the pump chamber and a discharge nozzle are connected, the chemical liquid supply method discharging the chemical liquid in the chemical liquid container to the discharge nozzle, the chemical liquid supply method comprising:
    a suctioning step of expanding the pump chamber with the suction channel being opened and causing the chemical liquid in the chemical liquid container to flow into the pump chamber;
    a filtering step of contracting the pump chamber with an inflow portion of the circulation channel being opened and filtering the chemical liquid supplied from the pump chamber by a filter;
    a returning step of expanding the pump chamber with an outflow portion of the circulation channel being opened and suctioning the filtered chemical liquid returned from the circulation channel to the pump chamber; and
    a discharging step of contracting the pump chamber with the discharge channel being opened and discharging the filtered chemical liquid in the pump chamber to the discharge nozzle, wherein
    an operation of circulating the chemical liquid in the chemical liquid container through the circulation channel and an operation of discharging the filtered chemical liquid in the circulation channel to the discharge nozzle are preformed by the pump.

5. The chemical liquid supply method according to claim 4, wherein the expanding and contracting portion is a tank forming an expanding and contracting chamber with an elastically deformable tank member.

* * * * *